(12) United States Patent
Kurumada et al.

(10) Patent No.: US 7,872,893 B2
(45) Date of Patent: Jan. 18, 2011

(54) SEMICONDUCTOR MEMORY DEVICE

(75) Inventors: Marefusa Kurumada, Kyoto (JP);
Satoshi Ishikura, Osaka (JP); Toshio Terano, Osaka (JP)

(73) Assignee: Panasonic Corporation, Osaka (JP)

( * ) Notice: Subject to any disclaimer, the term of this patent is extended or adjusted under 35 U.S.C. 154(b) by 348 days.

(21) Appl. No.: 11/961,166

(22) Filed: Dec. 20, 2007

(65) Prior Publication Data

US 2008/0151606 A1 Jun. 26, 2008

(30) Foreign Application Priority Data

Dec. 21, 2006 (JP) ............................... 2006-344096

(51) Int. Cl.
*G11C 5/06* (2006.01)
(52) U.S. Cl. ........................... 365/63; 365/72; 365/196; 365/205; 365/104
(58) Field of Classification Search ................... 365/63, 365/72, 196, 205, 105
See application file for complete search history.

(56) References Cited

U.S. PATENT DOCUMENTS

| | | | |
|---|---|---|---|
| 6,014,338 A | 1/2000 | Wang et al. | |
| 6,105,123 A | 8/2000 | Raje | |
| 6,243,292 B1 | 6/2001 | Kobayashi et al. | |
| 6,347,062 B2 | 2/2002 | Nii et al. | |
| 6,535,453 B2 * | 3/2003 | Nii et al. | 365/230.05 |
| 6,807,124 B2 | 10/2004 | Tsuda et al. | |
| 7,612,417 B2 * | 11/2009 | Osada et al. | 257/379 |
| 2002/0071324 A1 * | 6/2002 | Kitsukawa et al. | 365/200 |
| 2007/0025174 A1 | 2/2007 | Lee et al. | |

FOREIGN PATENT DOCUMENTS

| | | |
|---|---|---|
| JP | 2002-043441 | 2/2002 |
| JP | 2004-047003 | 2/2004 |
| JP | 2004-055130 | 2/2004 |

\* cited by examiner

*Primary Examiner*—Thong Q Le
(74) *Attorney, Agent, or Firm*—McDermott Will & Emery LLP

(57) ABSTRACT

A semiconductor memory device having a hierarchical bit line structure includes memory cells and an amplification circuit for amplifying a signal read from one of the memory cells via a bit line. A cell N-well region in which the P-channel transistors of the memory cell are formed and an amplification-circuit N-well region in which the P-channel transistors of the amplification circuit are formed are formed continuously.

22 Claims, 10 Drawing Sheets

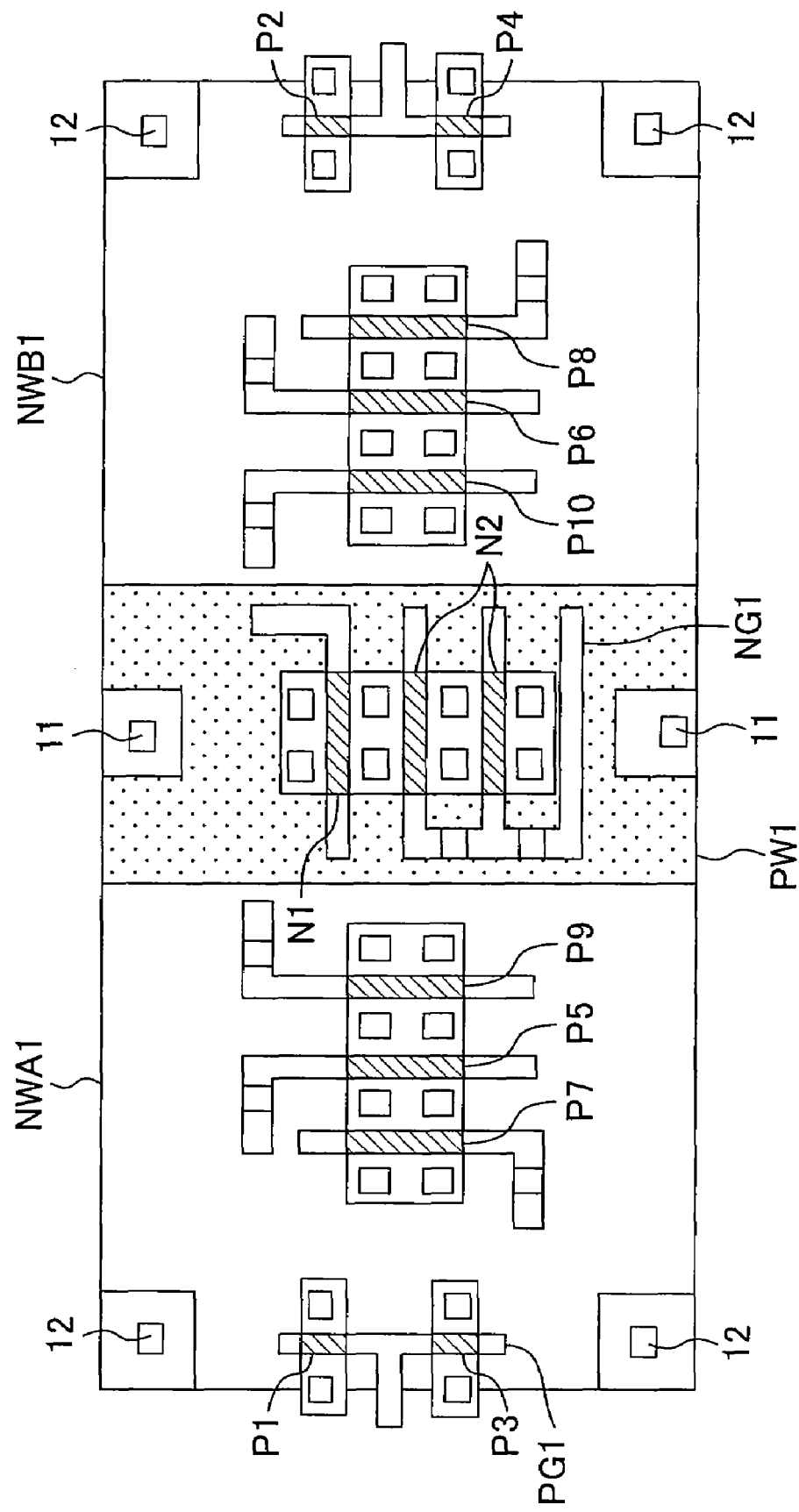

SEMICONDUCTOR MEMORY DEVICE

BACKGROUND OF THE INVENTION

1. Field of the Invention

The present invention relates to a semiconductor memory device such as a SRAM (Static Random Access Memory) having a hierarchical bit line structure and, more particularly, to a layout of an amplification circuit and the like on a semiconductor substrate.

2. Description of the Prior Art

A semiconductor memory device is composed of a plurality of memory cells and other circuits. Because the ratio of an area occupied by the memory cells to the total area of an LSI (Large Scale Integration) is high, there is a strong demand for a reduction in the area occupied by each of the memory cells. The same demand is also applied to a 1-port memory from and in which data is read and written via one port and to a multi-port memory from and in which data is simultaneously read and written via a plurality of ports including a read-only port.

In recent years, a memory in an ultra-small semiconductor device generation has tended to adopt a layout topology termed a horizontal cell structure or the like, in which the gate electrodes of transistors constituting memory cells are each formed in a direction perpendicular to bit lines. A multi-port memory to which a horizontal cell structure as mentioned above is applied is disclosed in, e.g., Japanese Laid-Open Patent Publication No. 2002-43441.

There is also known a memory having a hierarchical bit line structure. This type of memory has, e.g., a read amplification circuit for selecting one of signals read onto a plurality of bit lines, amplifying the selected signal, and outputting the amplified signal onto a global bit line. Amplification circuits as mentioned above are disclosed in, e.g., Japanese Laid-Open Patent Publication Nos. 2004-55130 and 2004-47003, U.S. Pat. Nos. 6,014,338 and 6,105,123, and the like.

In a conventional semiconductor memory device having a horizontal cell structure and a hierarchical bit line structure, each as mentioned above, and also having a read-only port, an N-well region in which the P-channel transistors of an amplification circuit are formed is formed to be isolated from an N-well region in which the P-channel transistors of memory cells are formed, in the same manner as in a control circuit, a column selector, a row decoder, or the like in a multi-port memory.

Specifically, a layout as schematically shown in, e.g., FIG. 9 can be considered. In the example of FIG. 9, memory cell portions M1 each including an optical dummy cell portion D1, substrate contact portions C1, N-well isolation portions S1, and an amplification circuit portion LAMP1 are provided on a semiconductor substrate. N-channel transistors constituting the individual portions are formed in a P-well region PW1, while P-channel transistors constituting the individual portions are formed in N-well regions NWA1, NWB1, NWC1, NWC2, NWD1, and NWD2. The N-well region NWA1 is isolated from the N-well regions NWC1 and NWC2 by the N-well isolation portions S1. The N-well region NWB1 is also isolated from the N-well regions NWD1 and NWD2 by the N-well isolation portions S1. In the P-well region PW1, the N-well region NWA1, and the like, substrate contacts 11 and 12 are provided.

The amplification circuit portion LAMP1 is specifically constructed as shown in FIG. 10. That is, P-channel transistors P1 to P10 (PMOS transistors) are formed in the N-well regions NWA1 and NWB1, while N-channel transistors N1 and N2 (NMOS transistors) are formed in the P-well region PW1. The gate electrodes PG1 of the P-channel transistors P1 to P10 are each formed in a direction (vertical direction in FIG. 10) parallel with bit lines not shown. The gate electrodes NG1 of the N-channel transistors N1 and N2 are each formed in a direction (lateral direction in FIG. 10) perpendicular to the bit lines.

However, in the case where the N-well regions NWA1 to NWD2 are formed in isolated relation as described above, regions where the N-well isolation portions S1 and the substrate contacts 12 are provided individually are needed so that an area occupied by the entire memory relative to the total area of the semiconductor substrate tends to increase.

SUMMARY OF THE INVENTION

It is therefore an object of the present invention to provide a semiconductor memory device wherein the area occupied by the entire memory relative to the total area of the semiconductor substrate can easily be reduced, while a yield reduction due to variations in processing accuracy and the like can easily be suppressed.

To solve the problem mentioned above, a semiconductor memory device according to the present invention has a hierarchical bit line structure comprising: memory cells; and an amplification circuit for amplifying a signal read from one of the memory cells via a bit line, wherein a cell N-well region in which P-channel transistors of the memory cells are formed and an amplification-circuit N-well region in which P-channel transistors of the amplification circuit are formed are formed continuously.

The arrangement allows a reduction in the length of the semiconductor memory device in the bit line direction because an isolation portion for isolating the N-well region and the like are not provided therein. In addition, a substrate contact for giving a potential to the N-well of each of the memory cells can easily be used commonly as a substrate contact for giving a potential to the N-well of the amplification circuit. As a result, the length in the bit line direction can further be reduced.

BRIEF DESCRIPTION OF THE DRAWINGS

FIG. 10 is a plan view showing a layout of an amplification circuit LAMP10 in the semiconductor memory device provided with the N-well isolation portions S1.

DESCRIPTION OF THE PREFERRED EMBODIMENTS

Figure 1:
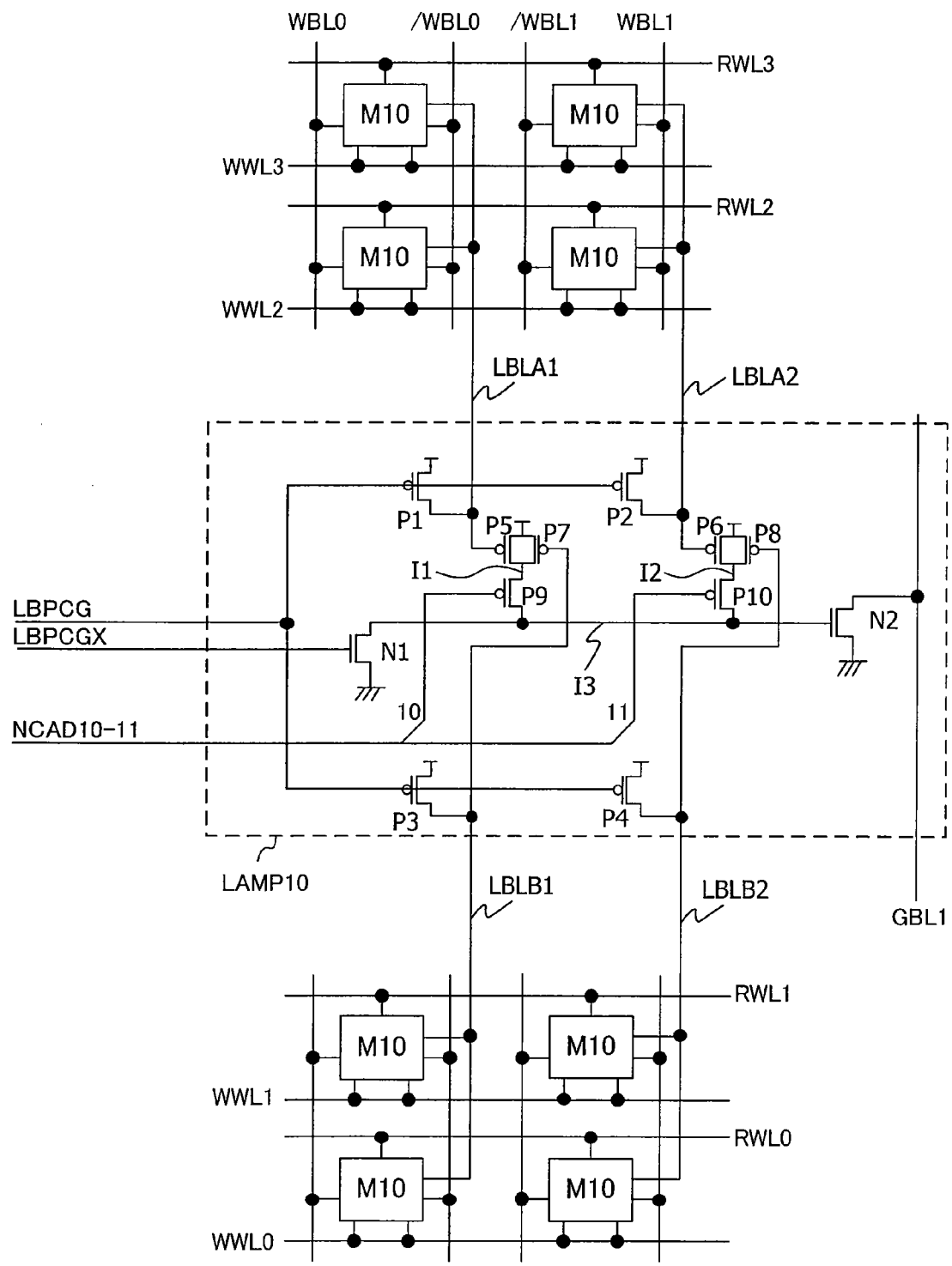
FIG. 1 is circuit diagram showing a structure of a principal portion of a semiconductor memory device according to an embodiment of the present invention.

Referring to the drawings, an embodiment of the present invention will be described hereinbelow in detail.

First, a description will be given to a circuit in a semiconductor memory device according to the present embodiment.

FIG. 1 is a circuit diagram showing a structure of a principal portion of the semiconductor memory device. An amplification circuit LAMP10 (local read amplification circuit) is connected to the respective read-only ports of a plurality of memory cells M10 provided as an array via read bit lines LBLA1, LBLA2, LBLB1, and LBLB2.

The amplification circuit LAMP10 is composed of P-channel transistors P1 to P10 (PMOS transistors) and N-channel transistors N1 and N2 (NMOS transistors). The P-channel transistors P1 to P4 pre-charge the respective read bit lines LBLA1 to LBLB2 in response to a pre-charge signal LBPCG. The P-channel transistors P5 to P8 raise a node 11 or 12 to "H (High level)" when the read bit lines LBLA1 to LBLB2 are at "L (Low level)". The P-channel transistors P9 and P10 select the node 11 or 12 (a row in the memory cell array) in response to select signals NCAD10 and NCAD11. The N-channel transistor N1 holds a node 13 at "L" during a standby period. The N-channel transistor N2 shifts a main bit line GBL1 to "L" when the node 13 is at "H".

Figure 2:
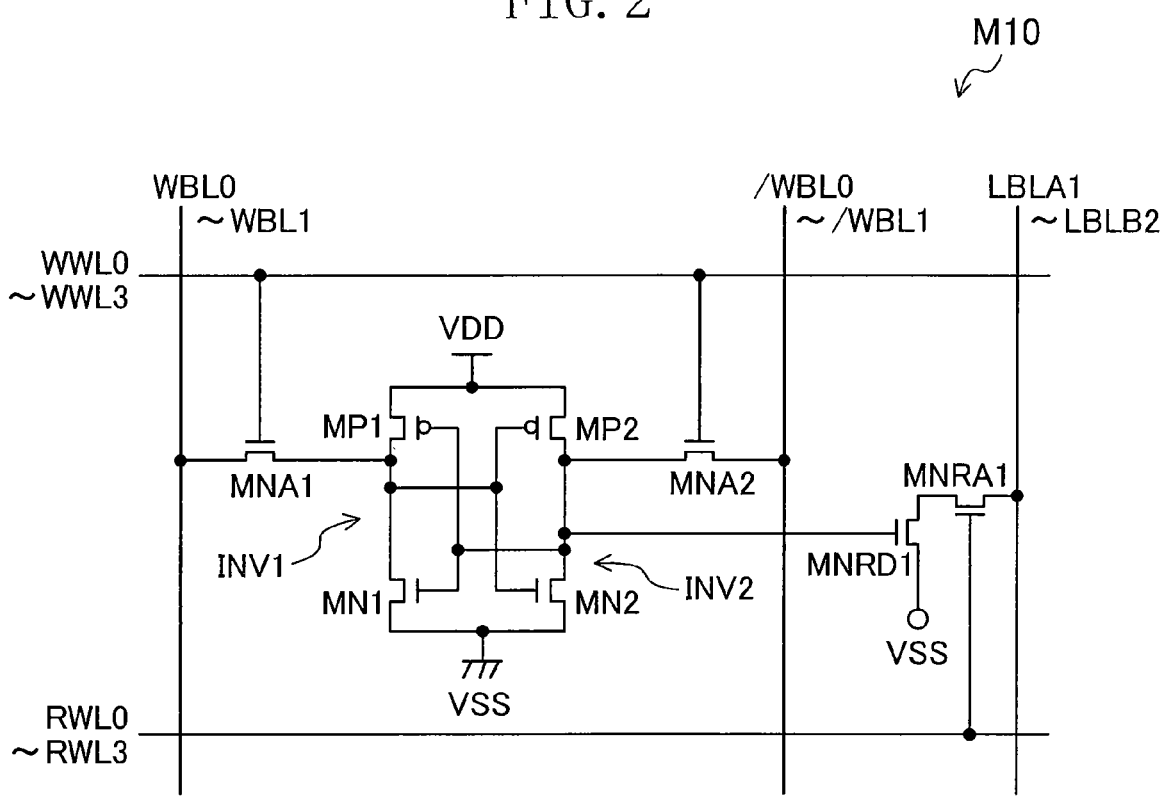
FIG. 2 is a circuit diagram showing a detailed structure of a memory cell M10 in the semiconductor memory device according to the embodiment.

FIG. 2 is a circuit diagram showing a detailed structure of each of the memory cells M10 having the respective read-only ports. The memory cell M10 has P-channel transistors MP1 and MP2, N-channel transistors MN1 and MN2, N-channel transistors MNA1 and MNA2, a read-port drive transistor MNRD1, and a read-port access transistor MNRA1.

The P-channel transistor MP1 and the N-channel transistor MN1 constitute a CMOS inverter INV1, while the P-channel transistor MP2 and the N-channel transistor MN2 constitute a CMOS inverter INV2. The CMOS inverters INV1 and INV2 have respective input/output terminals connected to each other to constitute a flip-flop circuit. When write word lines WWL0 to WWL3 shift to "H", the N-channel transistors MNA1 and MNA2 function as access gates (transfer gates) which cause the respective pairs of write bit line pairs WBL0, /WBL0 and WBL1, /WBL1 to conduct to the flip-flop circuit. The read port drive MNRD1 and the read-port access transistor MNRA1 shift the read bit lines LBLA1 and LBLB2 to "L" when read word lines RWL0 to RWL3 are at "H" and an output of the CMOS inverter INV2 is at "H".

Figure 3:
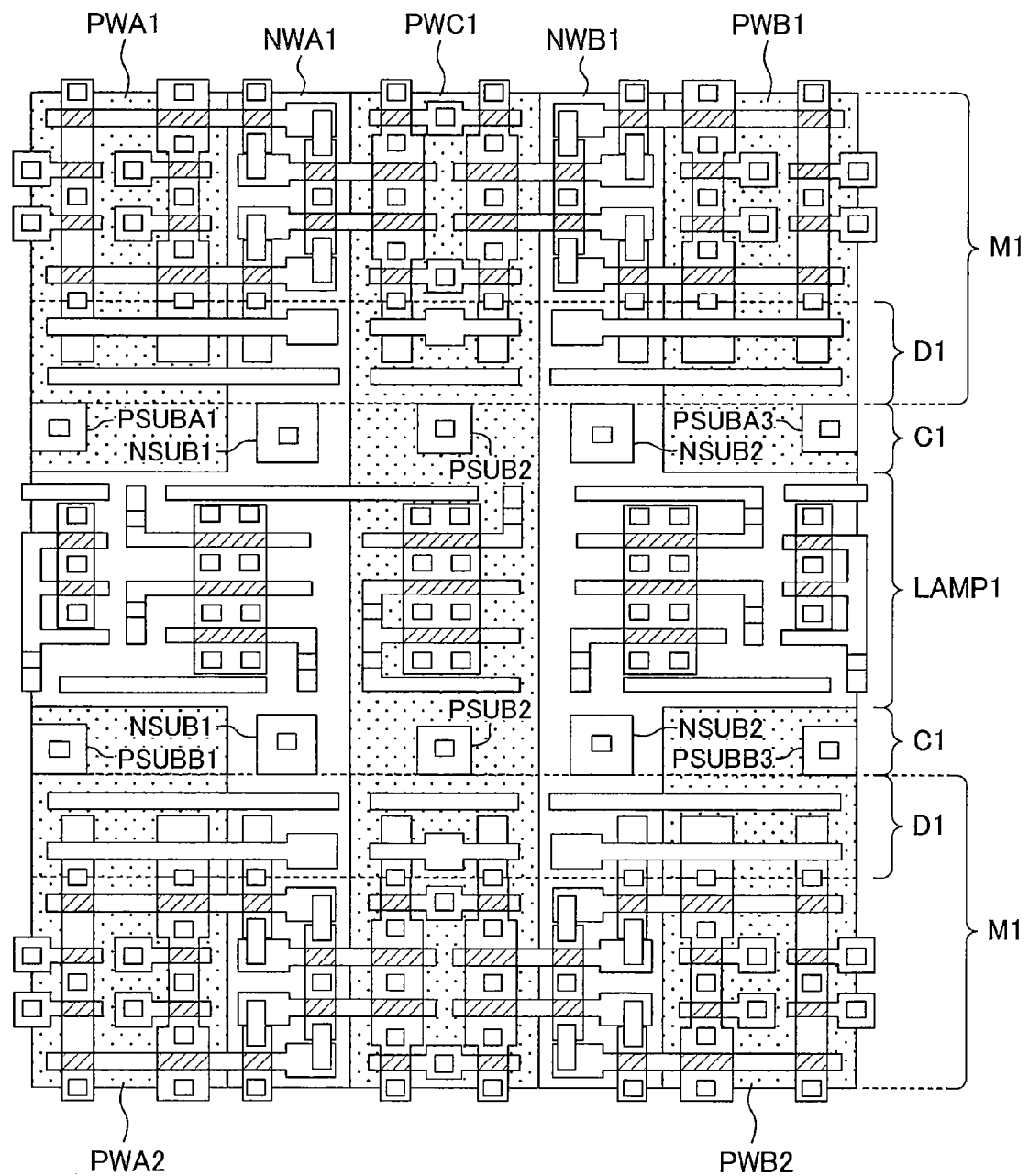
FIG. 3 is a plan view showing a layout of a semiconductor substrate in the semiconductor memory device according to the embodiment.

Next, a description will be given to a layout of individual elements, wiring, and well regions on a semiconductor substrate. As shown in FIG. 3, memory cell portions M1 each including an optical dummy cell portion D1, substrate contact portions C1, and an amplification circuit portion LAMP1 are provided on the semiconductor substrate. The N-channel transistors constituting the individual portions mentioned above are formed in the P-well regions PWA1, PWA2, PWB1, PWB2, and PWC1, while the P-channel transistors constituting the individual portions mentioned above are formed in the N-well regions NWA1 and NWB1. Although the connection of each of the nodes is provided by a wiring pattern formed in a plurality of metal wiring layers including, e.g., first and subsequent metal wiring layers, it is omitted in FIG. 3 and the like to simplify the description.

Figure 4:
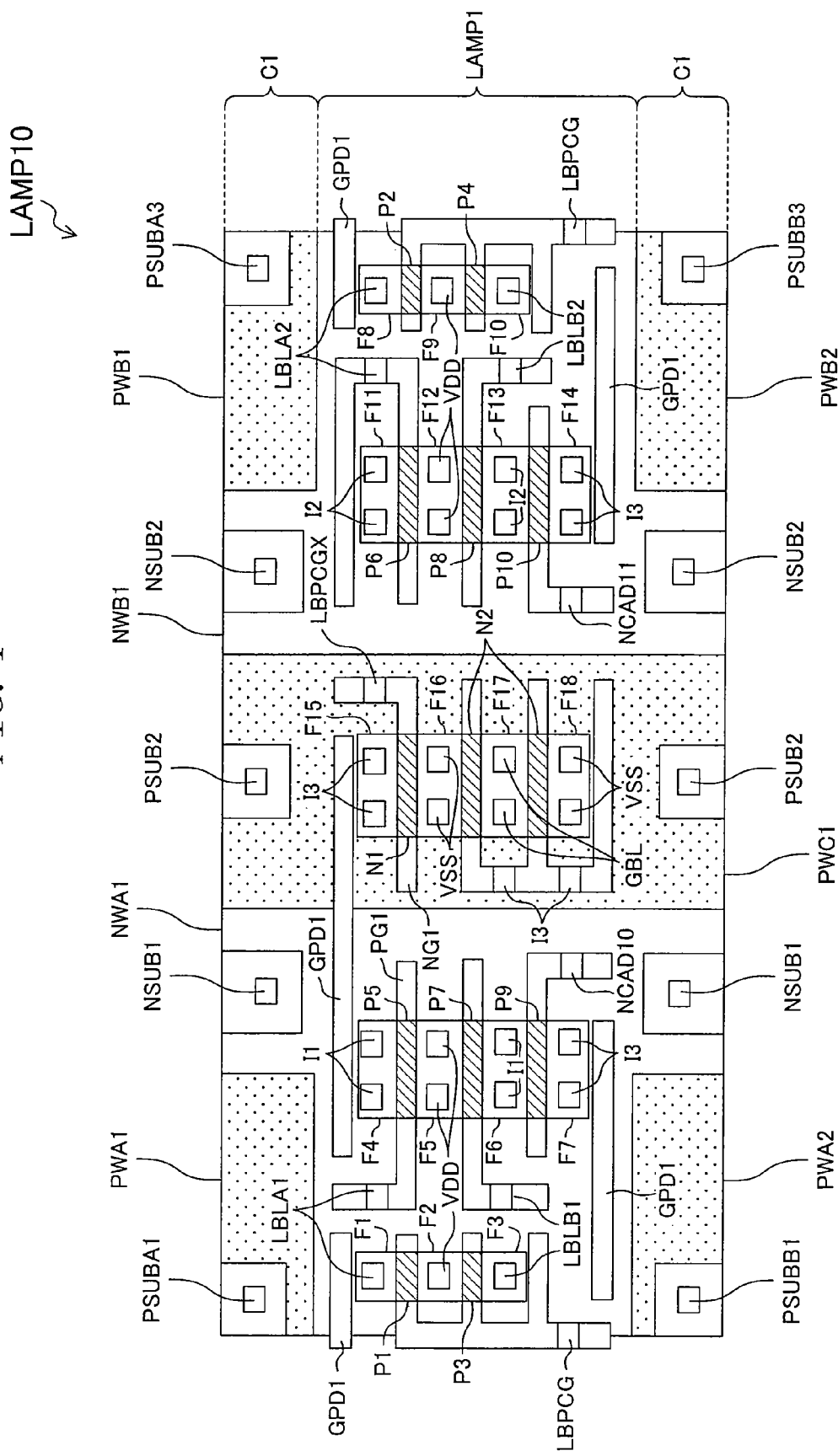
FIG. 4 is a plan view showing a layout of an amplification circuit LAMP10 in the semiconductor memory device according to the embodiment.

As shown in FIG. 4, the amplification circuit LAMP10 is placed in the amplification circuit portion LAMP1 mentioned above. The P-channel transistors P1 to P10 of the amplification circuit LAMP10 are formed in the N-well regions NWA1 and NWB1. The N-channel transistors N1 and N2 of the amplification circuit LAMP10 are formed in the P-well region PWC1. The gate electrodes PG1 of the P-channel transistors P1 to P10 and the gate electrodes NG1 of the N-channel transistors N1 and N2 are each formed in a direction (lateral direction in FIG. 4) perpendicular to each of bit lines not shown. The individual transistors are formed such that directions (e.g., the direction mutually connecting the $p^+$ diffusion regions F1 and F2 of the P-channel transistor P1) mutually connecting $p^+$ diffusion regions F1 to F14 or $n^+$ diffusion regions F15 to F18 serving as the sources and drains of the individual transistors are the same as the direction of each of the bit lines (vertical direction in FIG. 4). In the amplification circuit LAMP10, dummy gates GPD1 are further provided as appropriate.

In the substrate contact portions C1, P-well substrate contacts PSUBA1, PSUBB1, PSUB2, PSUBA3, and PSUBB3 and N-well substrate contacts NSUB1 and NSUB2 are provided each to give a predetermined potential.

Figure 5:
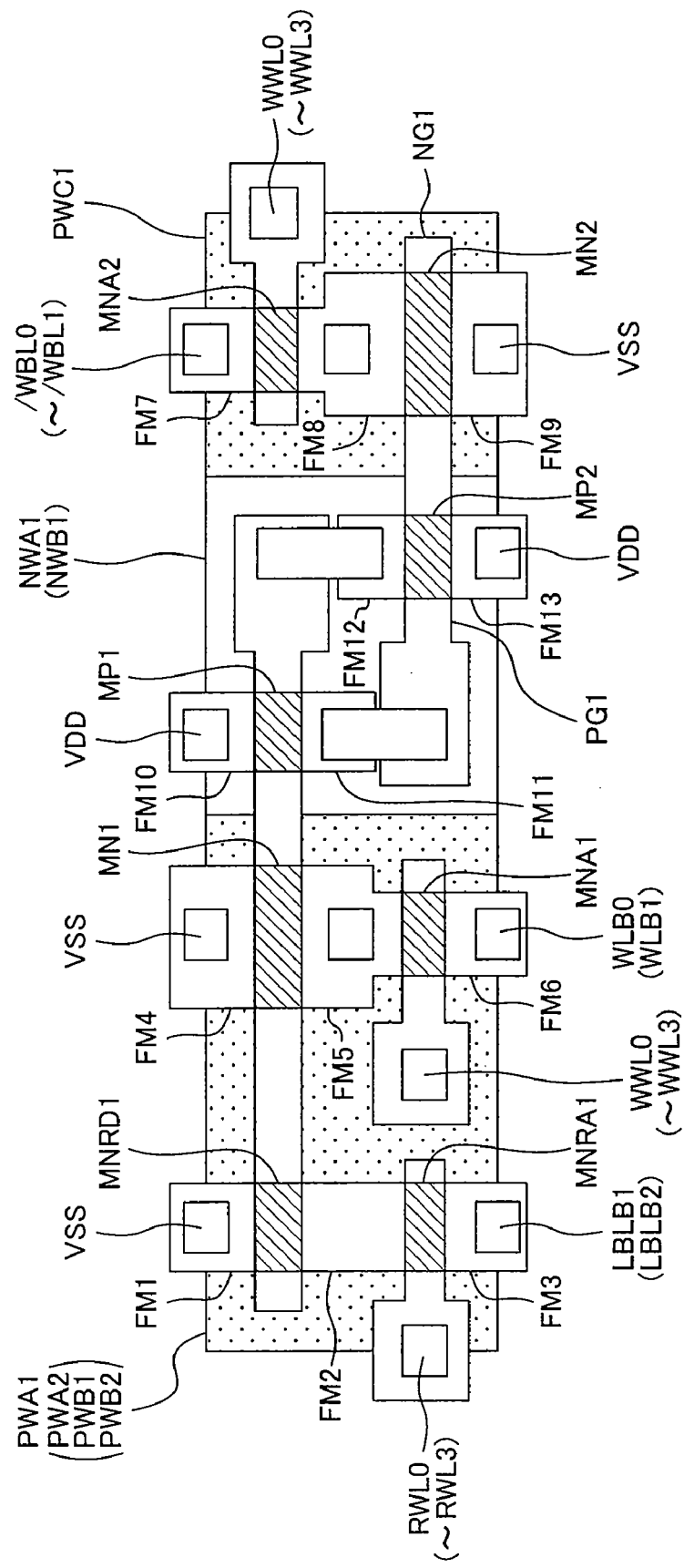
FIG. 5 is a plan view showing a layout of the memory cell M10 in the semiconductor memory device according to the embodiment.

Each of the memory cell portions M1 is composed of a plurality of memory cells M10 as shown in FIG. 5 which are arranged as an array. FIG. 5 shows a layout pattern of one of the memory cells M10, while each of the memory cells 10 other than that shown in FIG. 5 is formed in a pattern obtained by vertically and/or laterally inverting the pattern of FIG. 5. The P-channel transistors MP1 and MP2 are formed in the N-well region NWA1. The N-channel transistors MN1, MN2, MNA1, MNA2, MNRD1, and MNRA1 are formed in the P-well regions PWA1 and PWC1 disposed on both sides of the N-well region NWA1. The gate electrodes PG1 of the P-channel transistors MP1 and MP2 and the gate electrodes NG1 of the N-channel transistors MN1 and MN2 are each formed in the direction (lateral direction in FIG. 5) perpendicular to the bit lines, in the same manner as in the amplification circuit LAMP10. The individual transistors are formed such that directions mutually connecting the $p^+$ diffusion regions FM10 to FM13 or $n^+$ diffusion regions FM1 to FM9 of the individual transistors are also the same as the direction (vertical direction in FIG. 5) of each of the bit lines, in the same manner as in the amplification circuit portion LAMP1.

Figure 6:
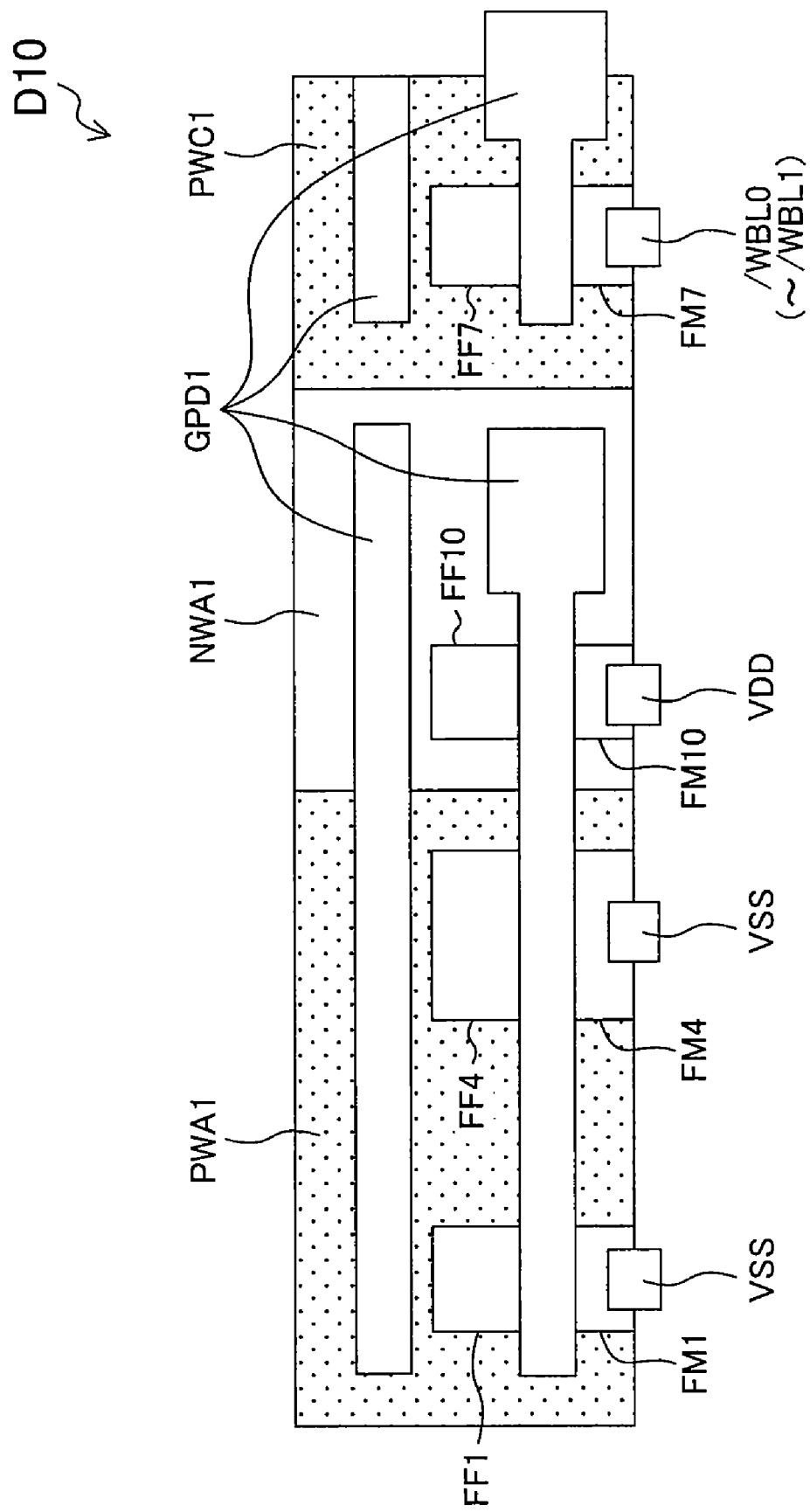
FIG. 6 is a plan view showing a layout of an optical dummy cell D10 in the semiconductor memory device according to the embodiment.

In the optical dummy cell portions D1 provided in the respective portions of the memory cell portions M1 closer to the amplification circuit portion LAMP1, optical dummy cells D10 as shown in FIG. 6 are provided. In each of the optical dummy cells D10, the $n^+$ diffusion regions FF1, FF4, FF7, FM1, FM4, and FM7, the $p^+$ diffusion regions FF10 and FM10, and the dummy gates GPD1 are formed in a pattern partly similar to that of the memory cell M10.

Figure 7:
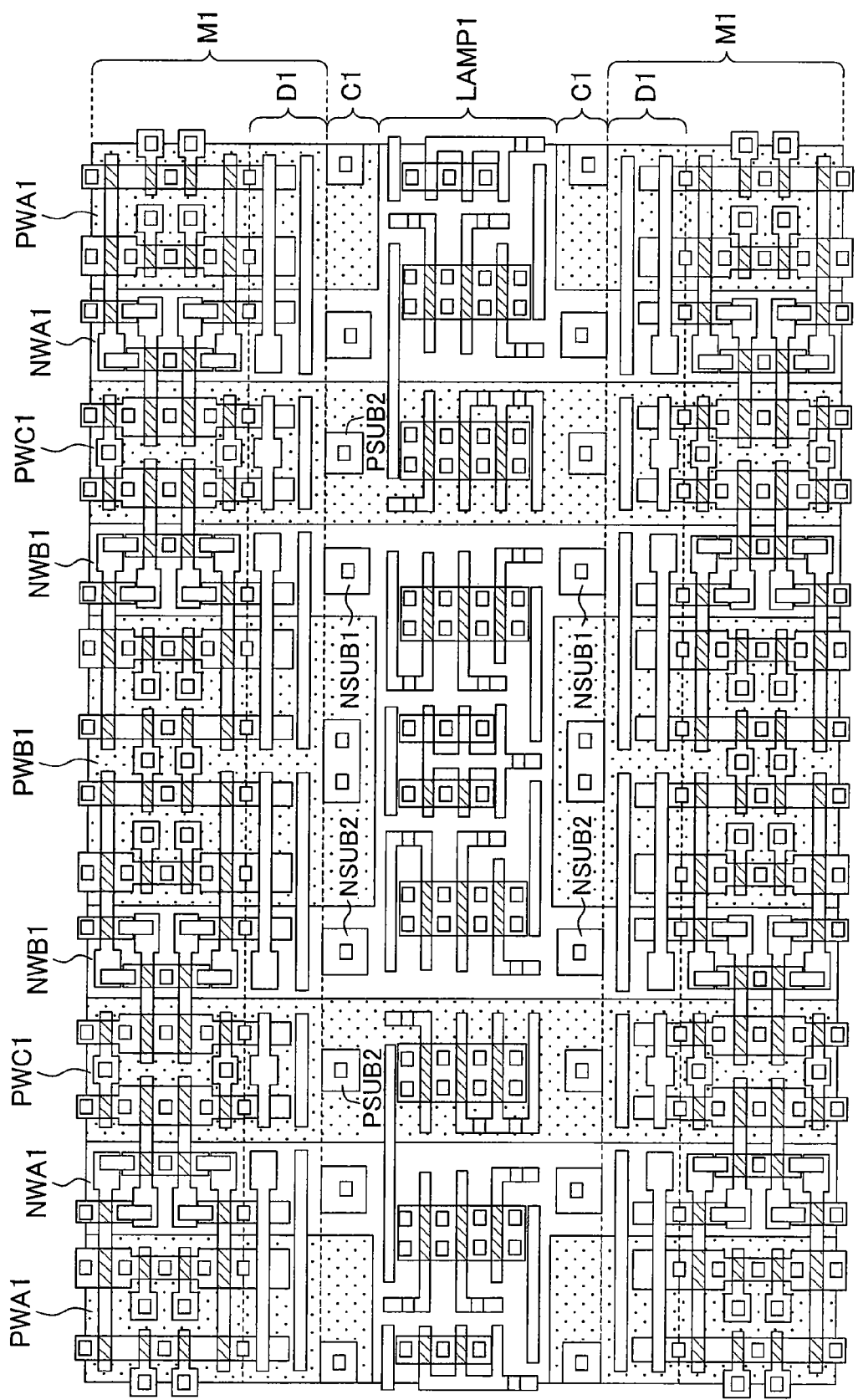
FIG. 7 is a plan view showing a layout of the semiconductor substrate over a wider range in the semiconductor memory device according to the embodiment.

In the semiconductor memory device thus constructed, the N-well region NWB1 is formed in a H-shaped configuration to extend continuously over the memory cell portions M1, the substrate contact portions C1, and the amplification circuit portion LAMP1, as shown in FIG. 7. In other words, because an isolation portion for isolating the N-well region NWB1 and the like are not provided, the length of the semiconductor memory device in the bit line direction can be reduced.

Moreover, by commonly using the same N-well substrate contact NSUB1, NSUB2, or the like to give a potential to the N-well region NWB1 of each of the memory cell portions M1 and the amplification circuit portion LAMP1, the area occupied by the semiconductor memory device relative to the total area of the substrate can also be easily reduced. The same also holds true with the P-well substrate contact PSUB 2 and the like.

By further placing the N-well substrate contacts NSUB2 in the vicinity of the four corners of the N-well region NWB1 in, e.g., the amplification circuit portion LAMP 1 according to the layout described above, the densities of the N-well substrate contacts NSUB1, NSUB2, and the like can easily be increased. Therefore, it is also possible to easily stabilize the potential of the N-well region NWB1 or the like.

By further providing the N-well region NWB1 at each of the memory cell portions M1 and the substrate contact portion C1 with the same widths as described above, the boundaries thereof with the P-well region PWC1 and the like can easily be formed linearly. As a result, it is possible to increase the accuracy with which each of the regions is formed and thereby easily reduce the area of the circuit. More specifically, it is possible to reduce the need to increase the area due to, e.g., the overlapping between the $n^+$ diffusion regions FM1 to FM9 in the N-channel transistors MN1 and MN2 of the memory cell M10 and the P-well regions PWB1 and PWC1 and/or the separation of the $n^+$ diffusion regions FM1 to FM9 mentioned above from the n-well region NWB1 of the amplification circuit LAMP10.

By thus forming the P-channel transistors P1 to P10 and the N-channel transistors N1 and N2, each constituting the amplification circuit LAMP10, such that the respective directions of the gate electrodes PG1 of the P-channel transistors P1 to P10 and the gate electrodes NG1 of the N-channel transistors N1 and N2 and the respective directions (source-to-drain directions) of the $p^+$ diffusion regions F1 to F14 and the $n^+$ diffusion regions F15 to F18 are the same as in each of the memory cells M10, it is possible to increase the accuracy of photolithographical processing by preventing the deformation of the gates and the diffusion layers due to interference during exposure to light and suppressing variations in the respective positions of the gate electrodes and the diffusion regions. In addition, a reduction in the distance between each of the memory cell portions M1 and the amplification circuit portion LAMP1 is easily achieved. This allows a further area reduction and facilitates a reduction in process defects in the fabrication process steps.

Although FIG. 7 shows an example in which the respective N-well regions NWB1 of the individual memory cells M10 which are adjacent to each other on the side on which the read-port drive transistors MNRD1 and the read-port access transistors MNRA1 are disposed are connected to the N-well region NWB1 of the same amplification circuit LAMP10, the present invention is not limited thereto. That is, depending on the ratio between the N-channel transistors and the P-channel transistors constituting each of circuits, the widths of the P-wells and N-wells determined by the circuit structure, and the like, the N-well region can also be formed in a H-shaped configuration by forming the respective N-well regions of the individual memory cells M10 adjacent to each other in a direction different from that shown above in continuous relation to the N-well region of the same amplification circuit LAMP10.

Figure 8:
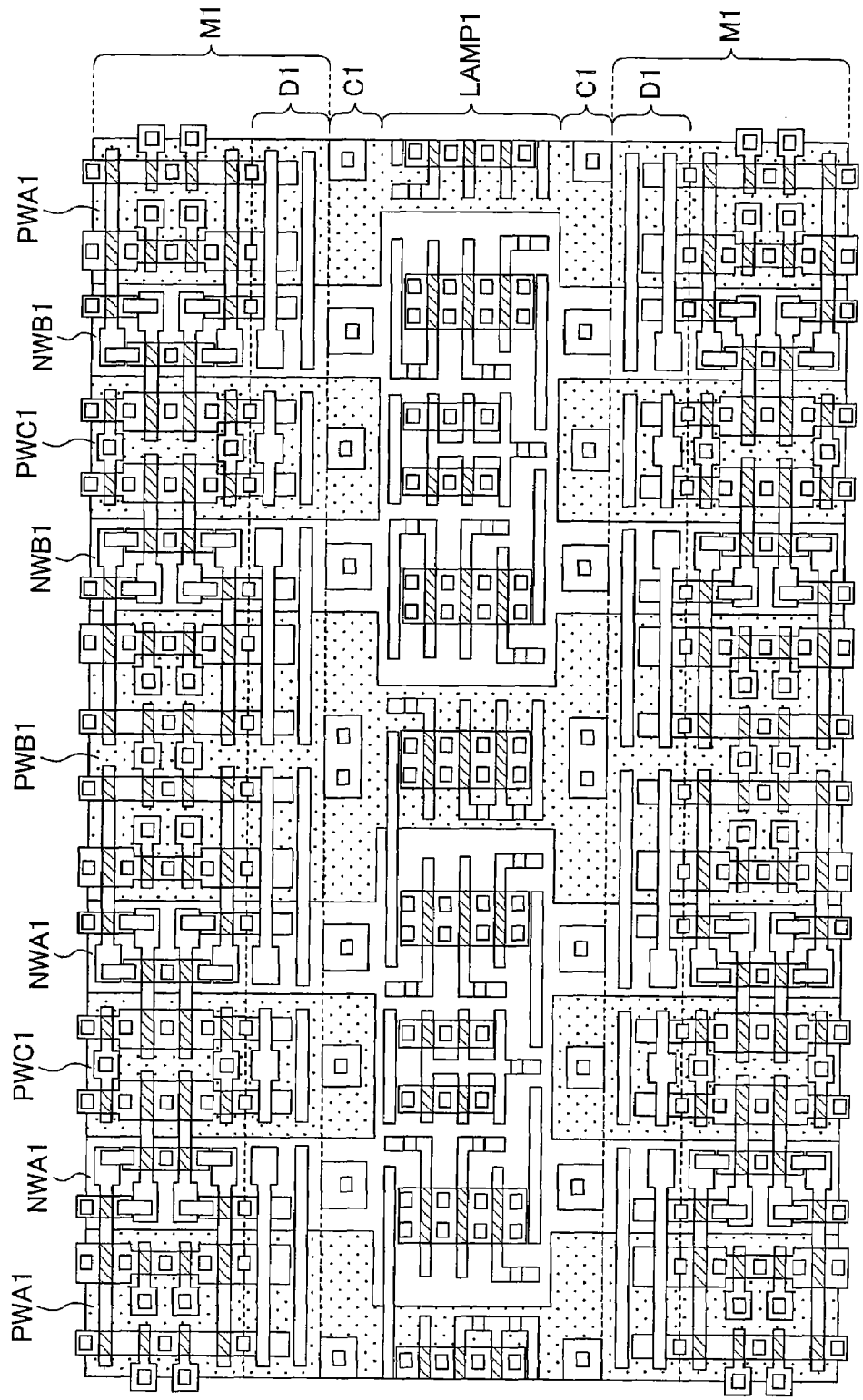
FIG. 8 is a plan view showing a variation of the layout of the semiconductor substrate in the semiconductor memory device according to the embodiment.
Figure 9:
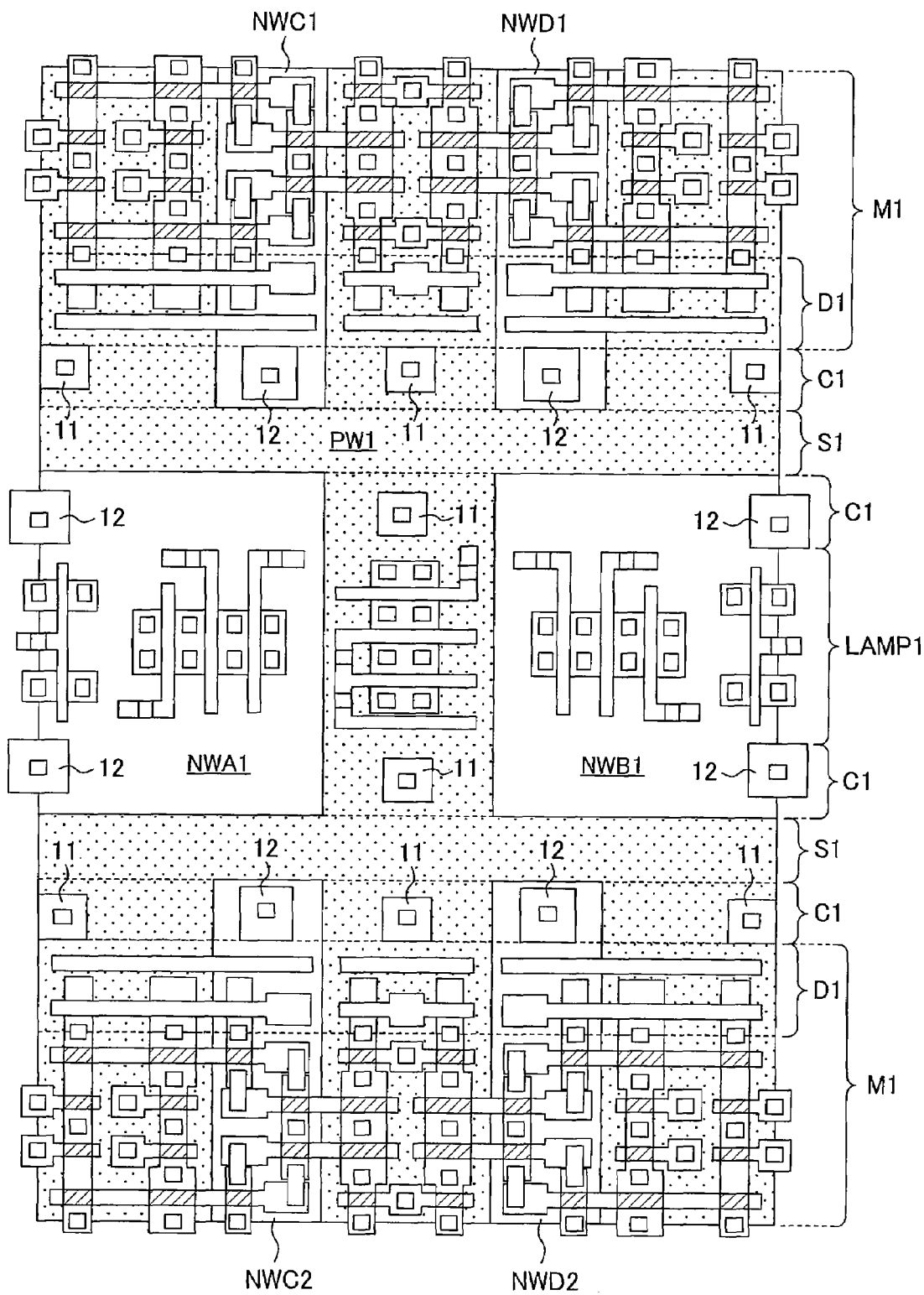
FIG. 9 is a plan view showing a layout of a semiconductor substrate in a semiconductor memory device provided with N-well isolation portions S1.

Further, as shown in, e.g., FIG. 8, it is similarly possible to achieve an area reduction due to no provision of an isolation portion for isolating the N-well region NWB1 and the like as well as an area reduction due to the common use of the same N-well substrate contacts for giving a potential to the N-well region of each of the memory cell portions M1 and the amplification circuit portion LAMP1 even though the N-well region is not necessarily formed in the H-shaped configuration.

The structure of the amplification circuit portion LAMP1 and the number of the memory cells M10 to be placed are not limited to those shown above. Although the present invention has shown an example of a 2-port memory having a read-only port, the present invention is not limited thereto and may also be applied to a single-port memory or a multi-port memory having a larger number of read/write ports. The present invention is not limited to a 2-column selection structure provided that a memory has a hierarchical bit line structure.

Thus, the area occupied by the entire memory relative to the total area of the semiconductor substrate can easily be reduced, while a yield reduction due to variations in processing accuracy can easily be suppressed.

What is claimed is:

1. A semiconductor memory device comprising:
   memory cells; and
   an amplification circuit for amplifying a signal read from one of the memory cells via a bit line, wherein
   a cell N-well region in which P-channel transistors of the memory cells are formed and an amplification-circuit N-well region in which P-channel transistors of the amplification circuit are formed, are formed continuously.

2. The semiconductor memory device of claim 1, wherein
   the cell N-well region and the amplification-circuit N-well region are formed continuously via a substrate-contact N-well region and
   the cell N-well region and the substrate-contact N-well region are formed to have equal widths.

3. The semiconductor memory device of claim 2, wherein respective edge portions of the cell N-well region, the substrate-contact N-well region, and the amplification-circuit N-well region which are in directions parallel with the bit line are formed linearly.

4. The semiconductor memory device of claim 2, wherein a predetermined potential is given to each of the cell N-well region and the amplification-circuit N-well region via a common substrate contact provided in the substrate-contact N-well region.

5. The semiconductor memory device of claim 1, wherein
   gate electrodes of the transistors constituting the memory cells are each formed in one predetermined direction and
   gate electrodes of the transistors constituting the amplification circuit are each formed in the same direction as the predetermined direction.

6. The semiconductor memory device of claim 1, wherein
   the transistors constituting the memory cells are formed such that directions connecting respective source diffusion regions and drain diffusion regions of the transistors are the same predetermined direction and
   the transistors constituting the amplification circuit are formed such that directions connecting respective source diffusion regions and drain diffusion regions of the transistors are the same predetermined direction.

7. The semiconductor memory device of claim 1, wherein
   gate electrodes of the transistors constituting the memory cells and gate electrodes of the transistors constituting the amplification circuit are each formed in a direction perpendicular to the bit line and
   the transistors constituting the memory cells and the transistors constituting the amplification circuit are formed such that directions connecting respective source diffusion regions and drain diffusion regions of the transistors constituting the memory cells and directions connecting respective source diffusion regions and drain diffusion regions of the transistors constituting the amplification circuit are parallel with the bit line.

8. The semiconductor memory device of claim 1, wherein the two or more cell N-well regions are formed continuously to the one amplification-circuit N-well region.

9. The semiconductor memory device of claim 8, wherein the respective cell N-well regions of two of the memory cells which are adjacent to each other in a direction perpendicular to the bit line are formed continuously to the one amplification-circuit N-well region.

10. The semiconductor memory device of claim 9, wherein
the two memory cells have respective data holding circuits and read-only ports,
the data holding circuits have N-channel transistors and P-channel transistors, while the read-only ports have N-channel transistors,
respective cell P-well regions in which the respective N-channel transistors of the data holding circuits and the read-only ports in the two memory cells are formed are formed continuously, and
the cell N-well regions disposed on both sides of the P-well regions and in which the P-channel transistors of the data holding circuits are formed are formed continuously to the one amplification-circuit N-well region.

11. The semiconductor memory device of claim 8, wherein the respective cell N-well regions of two of the memory cells disposed on both sides of the amplification-circuit N-well region relative to a direction of the bit line are formed continuously to the one amplification-circuit N-well region.

12. The semiconductor memory device of claim 8, wherein
the respective cell N-well regions of two of the memory cells which are adjacent to each other in a direction perpendicular to the bit line and the respective cell N-well regions of two of the memory cells disposed on both sides of the amplification-circuit N-well region relative to a direction of the bit line are formed continuously to the one amplification-circuit N-well region and
the N-well regions including the cell N-well regions and the amplification-circuit N-well region are formed in a H-shaped configuration.

13. The semiconductor memory device of claim 1, further comprising a hierarchical bit line structure.

14. The semiconductor memory device of claim 1, wherein the cell N-well region and the amplification-circuit N-well region are formed continuously via a dummy circuit N-well region.

15. The semiconductor memory device of claim 1, wherein the amplification circuit includes a pre-charge transistor, and said P-channel transistor formed in the amplification-circuit N-well region is the pre-charge transistor.

16. The semiconductor memory device of claim 15, wherein the cell N-well region and the amplification-circuit N-well region are formed continuously via a dummy circuit N-well region.

17. A semiconductor memory device comprising:
a cell N-well region;
memory cells including P-channel transistors; and
an amplification circuit for amplifying a signal read from one of the memory cells via a bit line, said amplification circuit including P-channel transistors,
wherein said P-channel transistors of the memory cells and said P-channel transistors of the amplification circuit are disposed in said cell N-well region.

18. The semiconductor memory device of claim 17, wherein said cell N-well region is a continuous region with any isolation element disposed between said P-channel transistors of the memory cells and said P-channel transistors of the amplification circuit.

19. The semiconductor memory device of claim 17, further comprising a hierarchical bit line structure.

20. The semiconductor memory device of claim 17, further comprising:
a dummy circuit including a P-channel transistor,
wherein said P-channel transistor of the dummy circuit is disposed between said P-channel transistors of the memory cells and said P-channel transistors of the amplification circuit.

21. The semiconductor memory device of claim 17, wherein the amplification circuit includes pre-charge transistors, and said P-channel transistors of the amplification circuit disposed in said cell N-well region are the pre-charge transistors.

22. The semiconductor memory device of claim 21, further comprising:
a dummy circuit including a P-channel transistor,
wherein said P-channel transistor of the dummy circuit is disposed between said P-channel transistors of the memory cells and said P-channel transistors of the amplification circuit.

* * * * *